United States Patent [19]

Sachdev et al.

[11] Patent Number: 5,955,543

[45] Date of Patent: *Sep. 21, 1999

[54] ARYL CYANATE AND/OR DIEPOXIDE AND HYDROXYMETHYLATED PHENOLIC OR HYDROXYSTYRENE RESIN

[75] Inventors: Krishna Gandhi Sachdev, Hopewell Junction; Michael Berger, Gardiner; Anson Jay Call, Poughkeepsie; Frank Louis Pompeo, Jr., Walden, all of N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/859,975

[22] Filed: May 21, 1997

Related U.S. Application Data

[63] Continuation of application No. 08/585,343, Jan. 11, 1996, abandoned.

[51] Int. Cl.$^6$ .............................. C08K 3/08; C08L 63/00; C08L 63/02; C08L 79/00
[52] U.S. Cl. ......................... 525/118; 523/458; 524/440; 525/486; 525/504
[58] Field of Search .................................. 525/504, 118, 525/486; 524/440; 523/458

[56] References Cited

U.S. PATENT DOCUMENTS

| | | | |
|---|---|---|---|
| 4,010,163 | 3/1977 | Hesse et al. | 525/503 |
| 4,369,304 | 1/1983 | Gaku et al. | 528/322 |
| 4,393,195 | 7/1983 | Gaku et al. | 528/361 |
| 4,555,553 | 11/1985 | Hefner, Jr. | 525/523 |
| 4,604,452 | 8/1986 | Shrimp | 528/422 |
| 4,740,584 | 4/1988 | Shrimp | 528/422 |
| 4,747,968 | 5/1988 | Gilleo | 252/514 |
| 4,785,075 | 11/1988 | Shrimp | 528/422 |
| 4,975,221 | 12/1990 | Chen et al. | 252/512 |
| 4,999,699 | 3/1991 | Christie et al. | 357/65 |
| 5,068,309 | 11/1991 | Shrimp et al. | 528/211 |
| 5,132,778 | 7/1992 | Juskey et al. | 357/72 |
| 5,149,863 | 9/1992 | Shrimp et al. | 560/301 |
| 5,250,848 | 10/1993 | Christie et al. | 257/778 |
| 5,319,244 | 6/1994 | Papathomas et al. | 257/701 |
| 5,350,635 | 9/1994 | Pokorny | 428/414 |
| 5,646,241 | 7/1997 | Dershem et al. | 528/210 |

FOREIGN PATENT DOCUMENTS

| | | |
|---|---|---|
| 1159908 | 6/1989 | Japan . |
| 4-300952 | 10/1992 | Japan . |

OTHER PUBLICATIONS

CAPLUS accession No. 1979:88891 for Japanese Patent No. 53-134034, Hitachi Chemical Co., Ltd., Nov. 1978.

CAPLUS accession No. 1989:536173 for Japanese Patent No. 1-95164, Kansai Paint Co., Ltd., Apr. 1989.

J. E. Ireland, "Epozy Bleedout in Ceramic Chip Carriers" Int. J. Hybrid Microelectronics, V. 5, No. 1, Feb. 1982, pp. 1–4.

*Primary Examiner*—Robert E. Sellers
*Attorney, Agent, or Firm*—Tiffany L. Townsend; Steven J. Soucar

[57] ABSTRACT

An adhesive for bonding a die of an integrated circuit chip comprises an aryl cyanate (ester) resin alone and/or a diepoxide resin admixed with a hydroxymethylated phenolic resin or hydroxymethylated poly(hydroxystyrene) which can further contain an electrically or thermally conductive filler.

18 Claims, No Drawings

ARYL CYANATE AND/OR DIEPOXIDE AND HYDROXYMETHYLATED PHENOLIC OR HYDROXYSTYRENE RESIN

The application is a continuation of application Ser. No. 08/585,343, filed Jan. 11, 1996, abandoned.

TECHNICAL FIELD

This invention generally relates to adhesives for bonding a die to a surface. More particularly, the invention relates to conductive adhesives that reduce or eliminate resin bleed and provide enhanced die to substrate bond integrity when exposed to elevated temperature and humidity.

BACKGROUND OF THE INVENTION

Integrated circuit chips, which are also referred to as dies, are often assembled in electronic packages that include the die and a substrate. The substrate has a gold plated or unmetallized ceramic surface to which the die is mechanically attached using an organic polymer-based adhesive. The surface is the floor of a cavity which is defined by one or more tiers that surround the surface. Alternatively, the surface is an entire side of the substrate, i.e., there is no cavity. Surrounding the surface, either on the tier(s) or co-planar with the surface, are wire bond pads to which the die is electrically connected to the substrate by wires that run from the die to the wire bond pads. In hybrid applications, wire bonding results in interconnections that are chip-to-chip, chip-to-passive component or the like. Representative devices that use the electronic packages are computers, automobiles, calculators and other consumer and industrial products.

High performance reliability of the mechanical bonding of the die to the substrate requires that adhesive: has good adhesion to the die and the surface; shows no resin-bleed; has good high temperature stability; and maintains adhesive bond integrity during temperature and humidity stress exposure.

The adhesive is often a silver filled epoxy or cyanate ester. A common problem with conventional silver filled epoxies is that the epoxy resin separates, or "bleeds", out of the adhesive during die attachment and/or curing of the adhesive. Resin bleed out is related to surface porosity, surface wettability and adhesive type, Ireland, *Int. J. Hybrid Microelectronics*, Vol 5, No 1, pp 1–4 (February 1982). Bleed out can be reduced by implementing a bake of the metallized substrate at elevated temperatures and reduced pressure prior to bonding to change the surface properties The die must be attached within a few hours which is not always possible. The bake process does not work satisfactorily on non-metallized surfaces. Epoxy based adhesives are unable to withstand high temperatures, e.g., greater than 200–220° C., and therefore are unsuitable for high temperature applications.

The cyanate ester adhesives also have the problem of resin bleed out on metallized and unmetallized ceramic surfaces. Silver filled cyanate ester-based adhesives have a problem of adhesion degradation during temperature and humidity stress exposure at 85°/85% humidity which limits their use to packages that are hermetically sealed to keep out moisture.

An adhesive exhibiting reduced bleed out and which does not exhibit the above shortcomings is highly desirable.

SUMMARY OF THE INVENTION

This invention provides conductive adhesives that are characterized by the reduction or elimination of resin bleed out, good high temperature stability and maintenance of die to substrate bond integrity under temperature and humidity stressing at 85° C./85% humidity. The adhesives include a resin that is an aryl dicyanate monomer based cyanate ester resin or an epoxy resin and an additive that is a functionalized oligomeric/polymeric phenolic resin having the formula:

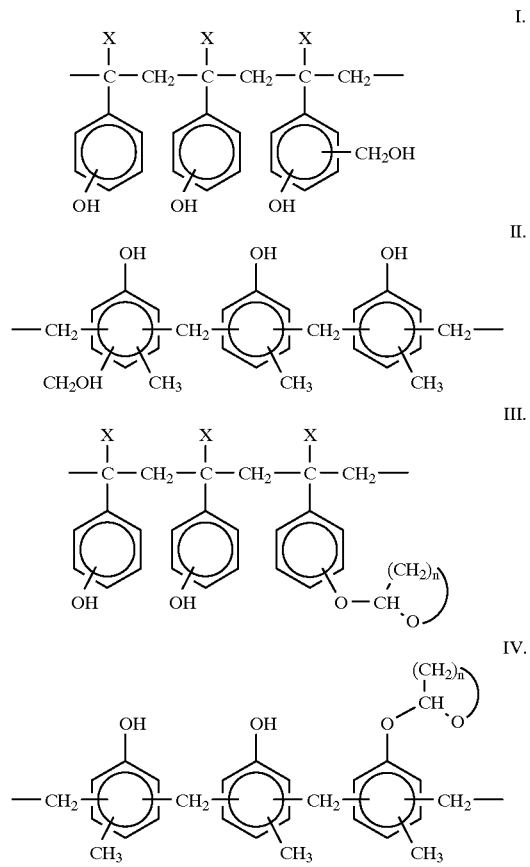

wherein X is H, $CH_3$ or $C_2H_5$ and n is 3 or 4. Other additives in this category include tetrahydropyranyl protected bisphenol A and the like. The adhesive can also include a conductive material, e.g., silver flakes, and a catalyst for curing the cyanate ester to a thermoset polymer matrix. Alternative adhesives include blends of the cyanate ester resin and the epoxy resin and the functionalized oligomeric/polymeric phenolic additive of formula I.

Numerous other advantages and features of the present invention will become readily apparent from the following detailed description of the preferred embodiments and the appended claims.

DETAILED DESCRIPTION OF THE PREFERRED EMBODIMENTS

The adhesive of the present invention includes a resin that is a cyanate ester resin or epoxy resin and an additive which is a functionalized oligomeric/polymeric phenolic resin having the following formula:

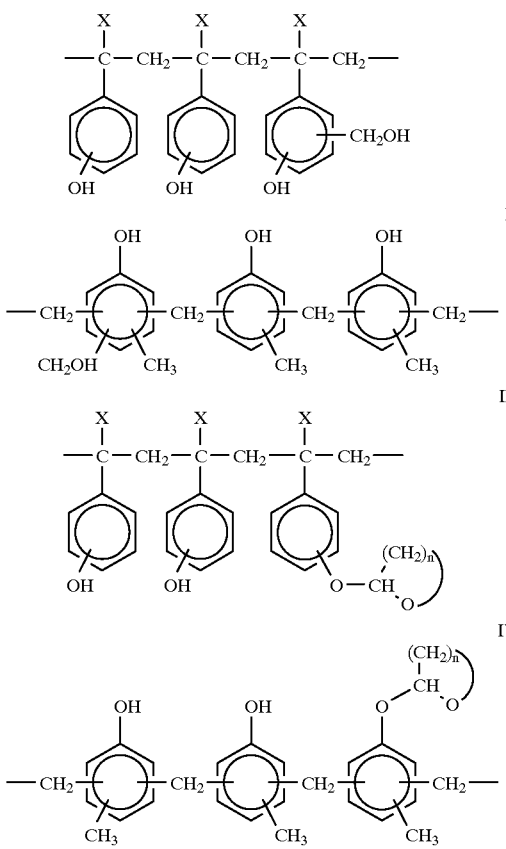

wherein X is H, CH₃ or C₂H₅ and n is 3 or 4. A conductive material in admixture with the resin and additive makes the adhesive conductive. The conductive material is dispersed in the resin or resin and additive mixture to produce a dispersion or paste.

The resin is preferably an aryl dicyanate monomer based cyanate ester having 5–20% of the monomeric functionality converted to triazine rings or a prepolymer, an epoxy or admixture thereof. The cyanate ester resin is primarily made up of the monomer with only a minor amount of the trimerized polymer being present. Preferred resins are liquid at about room temperature, i.e., about 20° to about 35° C.; albeit solid resins can be used if a suitable solvent is used to dissolve the solid.

Representative aryl dicyanate-based prepolymers include the prepolymer commercially available from Ciba-Geigy Corporation, Hawthorne, N.Y., under the designation Arocy L10, the liquid dicyanate monomer ethylidene bis 4,1-phenylene dicyanate (described in U.S. Pat. No. 4,839,442 to Craig) and in a paper by Shimp and Craig, presented at the 34th International Symposium in Reno, May 8–11, 1989, the dicyanate with cycloaliphatic bridging group commercially available from Dow Chemical Co. under the designation XU-71787, dicyanates of the type NCO—(AR)—R₁—(AR)—OCN where R₁ is selected from the group of O, SO₂ and C(CH₃)₂ and AR represents an aryl group (which is commonly referred to as Arocy B10), liquid dicyanate ester monomer derived from 4,4'-[1,3 phenylene bis (1-methylethyl-idene bisphenylcyanate)]; 4,4-dicyanato-2, 2-diphenyl perfluoropropane (Arocy F10); bis(4-cyanatophenyl)ether; tetra-o-methyl bisphenol F dicyanate; like cyanate ester resins based on bisphenol A which are commercially available from Ciba-Geigy and Rhone Poulenc, Inc, Louisville, Ky. and mixtures thereof.

The epoxy resin is an aromatic cycloaliphatic, aliphatic or bisphenol A based diepoxide.

Representative epoxy resins include: 3,4-epoxy cyclohexyl methyl-3,4-epoxy cyclohexane carboxylate, commercially available from Union Carbide under the designation ERL 4221; bis-3,4-epoxy cyclohexyl adipate; bis-epoxide derived from 4-vinyl-1-cyclohexene commercially available from Union Carbide under the designation ERL 4206; bis-(3,4-epoxycyclohexyl) adipate commercially available from Union Carbide under the designation ERL 4289; bis-glycidyl ethers such as 2,2-bis (4-glycidoxyphenyl) propane; 1,4-butane diol diglycidyl ether; diglcidyl ether of bisphenol F; the like and mixtures thereof.

These epoxies are used in conjunction with conventional anhydride hardeners such as hexahydrophthalic anhydride, methyl hexahydrophthalic anhydride, maleic anhydride and the like.

The reactive additive is selected to react with the cyanate resin or the epoxy resin and also undergo a self-condensation reaction during curing. The additive is a prepolymer or polymer and preferably is miscible without organic solvent with the liquid dicyanate monomer/prepolymer and the epoxy resin. The number average molecular weight of the additive is preferably in the range of about 1,000 to about 8,000 daltons.

Representative additives include hydroxymethyl novolak resin (i.e., hydroxymethyl-cresol formaldehyde resin); hydroxymethyl poly-(hydroxystyrene), hydroxymethyl α-methyl-poly-(hydroxy styrene); acetal protected phenolic resins such as polyhydroxystyrene and novolak resins partially protected as tetrahydropyranyl or tetrahydrofuranyl ether groups; low molecular weight (about 2,000 to 4,000 daltons) poly(hydroxystyrene); hydroxypolyimides; siloxane polyimides; polyimides; the like and mixtures thereof. Common elements of these additives are that they are soluble in amounts in the range of about 5–15 wt % with Arocy L10 based on the total weight of the additive and the Arocy L10 at room temperature, have reactive groups such that during curing the additives interact with the cyanate group and also can undergo self-condensation to form higher molecular weight interpenetrating networks. Low molecular weight, i.e., a molecular weight of about 2,000 to about 4,000 daltons was defined as 2,000–4,000] poly(p-hydroxy styrene) can be used without requiring the use of an organic solvent. A higher percentage of hydroxymethylation of the poly(p-hydroxystyrene) or novolak produces a resin that is insoluble in the cyanate resin.

Similarly, novolak resin with a molecular weight of about 1,000 to about 2,000 daltons hydroxymethylated to introduce up to 15% —CH₂OH when used as an additive dissolves in Arocy L10 at a weight ratio of up to 6:1, resin to hydroxymethylated novolak resin.

The hydroxymethyl cresol formaldehyde resin (i.e., the hydroxymethyl novolak) and hydroxymethyl poly-p-hydroxy styrene have a degree of hydroxymethylation in the range of about 5 to about 20, preferably about 5 to about 15, percent based on the molar equivalent of formaldehyde used for a molar equivalent of the monomer unit of novolak or poly(hydroxy-styrene). If the degree of hydroxymethylation is too high the adhesive cannot be dissolved in Arocy L10 without an organic solvent. If it is too low, the additive is less effective in eliminating/reducing resin bleed out and providing resistance to the degradative effects caused by high temperature and humidity.

Acetal group protected phenolic resins, specifically poly (p-hydroxystyrene) and novolak, having 10 to about 30 percent of the hydroxyl groups converted to tetrahydropyranyl ether or tetrahydrofuraryl ether, dissolves in cyanate esters in an amount up to about 20 wt % based on the combined weight of the resin and cyanate ester without using an organic solvent. Acetal protected phenolic resins are described in Hayashi et al, *ACS Polymeric Materials Science and Technology* Vol 61, p447 (1989) and Hesp et al, *Journal of Applied Polymer Science* Vol 42 pp877–883 (1991), although Hesp describe their use in the unrelated photoresist art.

The resin and additive are admixed together in a resin:additive weight ratio in the range of about 95:5 to about 80:20.

The adhesive preferably also includes an electrically or thermally conductive filler. The electrically conductive filler is preferably a highly conductive metal, such as silver, gold, copper and nickel, and preferably is in the form of flakes. The thermally conductive fillers can be AlN, $SiO_2$, SiC, BN, the like and mixtures thereof. The weight ratio of resin and adhesive admixture to filler is preferably in the range of about 15:85 to about 50:50.

The adhesive can also include conventional hardeners and catalysts such as organometallic catalysts, e.g., stannous octoate and dibutyl-tin dilaurate, metal naphthenates, the like and mixtures thereof, as described in U.S. Pat. No. 4,604,452 to Shimp and acetylacetonate/alkylphenol curing catalysts as described in U.S. Pat. No. 4,785,075 to Shimp, and optionally a conventional surfactant.

The adhesive is prepared according to standard techniques for preparing polymer and filler dispersions which involves blending the filler in the resin or the resin and additive using a blender or mixer and mixing to produce a substantially homogeneous dispersion which is then degassed and stored at a temperature of –20° C. For bonding the die to the substrate in a manual operation, the adhesive is dispensed as a bead or lines on the surface and the die is placed thereon with gentle pressure. Alternatively, the die can be bonded using a conventional tool. The substrate and die assembly is subsequently heated to a temperature in the range of about 150 to about 200° C. for a time period in the range of about 10 to about 45 minutes to cure the adhesive.

The following examples are given by way of illustration and not limitation.

EXAMPLE 1

Conductive Adhesive with Arocy L10 Resin and Hydroxymethyl Poly(P-Hydroxystryrene) Additive In a suitable vessel, 0.35 grams (gms) of hydroxymethyl poly(p-hydroxystyrene) having 10% hydroxymethylation was dissolved in 4.2 gms Arocy L10 at a temperature of 55° C. with stirring to obtain a resin and additive mixture that includes 8 wt % additive. The resulting mixture was cooled to room temperature and 25 milligrams (mg) of a catalyst solution containing 6 wt % copper acetyl acetonate in 94 wt % nonylphenol was introduced into the vessel and mixed. Then, 13.5 gms of silver flakes having an average size of less than 10 microns was introduced with mixing. Mixing continued for 30 minutes with an inert gas blanket to produce the adhesive which was a homogeneous dispersion. The adhesive is degassed prior to being stored in an air tight container at a temperature less than –20° C. for an extended time period. Prior to use, the adhesive is thawed to room temperature before opening the container to prevent absorption of the moisture by the adhesive.

EXAMPLE 2

Attachment of Dies to Substrates

The adhesive of EXAMPLE 1 was used to attach dies to ceramic substrates. One of the substrate surfaces to which dies were attached was gold plated and another was unmetallized ceramic. A conventional bead of the adhesive was dispensed on the surface. A 12×7 millimeter die was placed on the adhesive and slight pressure applied until a fillet was visible. The die, substrate and adhesive were placed in an oven having a nitrogen gas purge at a temperature of 170° C. for a time period of about 15–20 minutes to cure the adhesive, form a strong bond between the die and the surface and produce a die and substrate assembly.

There was no evidence of resin bleed out after the adhesive was dispensed or cured. The absence of bleed out was confirmed by surface analysis using x-ray photoelectron spectroscopy of the surface. A conventional die shear test showed that the shear strength was greater than 10 kilograms (kg) for the 12×7 mm die for both the gold plated and ceramic surfaces. To determine the effect of thermal shock, the assembly was subjected to 1,000 thermal cycles of –65° to +150° C. followed by the shear test. The test results for the shear test after the thermal stress showed no reduction in shear strength. To determine the effect of temperature and humidity, the assembly was exposed to conditions of 85° C. and 85 % humidity for two weeks followed by the shear test. The test results showed no discernable difference in shear strength after the exposure to elevated temperature and humidity.

EXAMPLE 3

Comparative Conductive Adhesive with Arocy L10 having 3.5 Wt % Hydroxymethyl-Poly(P-Hydroxystyrene) Additive In a suitable vessel, 0.36 gms of hydroxymethyl-poly(p-hydroxystyrene with 8% hydroxymethylation was dissolved in 10.5 gms of Arocy L10 with mixing to produce a resin and additive mixture having about 3.5 wt % additive. Then, 50 mg of a catalyst solution including 6 wt % copper acetyl acetonate in 94 wt % nonylphenyl was introduced into the vessel and mixed. Then, 33 gms of silver flakes having an average size of less that 10 microns were introduced with mixing. Mixing continued for 30 minutes with an inert gas blanket to produce a comparative adhesive that was a homogeneous dispersion.

The comparative adhesive was subjected to the tests described in EXAMPLE 2. The tests showed that the comparative example had resin bleed out on both the gold plated and ceramic surface. The shear strength was greater than 10 kg.

EXAMPLE 4

Conductive Adhesive with Cyanate Ester Resin and Epoxy Resin Blend Containing Hydroxymethyl Poly(P-Hydroxystyrene) Additive In a suitable vessel, 12.1 gm of a solution (prepared by dissolving 4.6 gms hexahydrophthalic anhydride in 7.5 gm of the cycloaliphatic diepoxide ERL 4221 at a temperature of 60° to 70° C. followed by cooling to room temperature) was mixed with 2.5 gm hydroxymethyl poly(p-hydroxystyrene) (10% hydroxymethylation) and 4.2 gm of the cyanate ester resin Arocy L10 with an inert gas blanket. Then, 50 mg of benzyl dimethyl amine, and 50 mg of a catalyst solution containing 6 wt % copper acetyl acetonate in 94 wt % nonylphenyl were introduced into the vessel and mixed. Then, 50 gms of silver flakes having an average size of less that 10 microns were introduced with mixing. Mixing continued for 30 minutes with an inert gas blanket to produce the adhesive that was a homogeneous dispersion.

The adhesive was tested as described in EXAMPLE 2. The test results showed no significant bleed out on the gold plated or ceramic surfaces. The shear strength was greater than 10 kg. After each of the thermal shock test and the temperature and humidity test, the shear strength was not degraded.

EXAMPLE 5

Conductive Adhesive with Arocy L10 and Tetrahydrofuranyl Ether Protected Poly(P-Hydroxystyrene) Additive The partially protected poly(p-hydroxystyrene) was prepared by the reaction of poly(p-hydroxystyrene) having a molecular weight of about 6,000 daltons with 2,3-dihydrofuran according to known procedures to obtain the additive having about 20% of the hydroxyl groups converted to the tetrahydrofuranyl derivative. A conductive adhesive using the above additive in place of the additive of EXAMPLE 1 was prepared using the procedure, dure, components and amounts described in EXAMPLE 1. The adhesive was tested according to the tests described in EXAMPLE 2. Die sheer strength, thermal shock, and temperature and humidity exposure tests showed satisfactory results.

EXAMPLE 6

Hydroxymethylation of Poly(P-Hydroxy Styrene)

In a suitable vessel, 25 gm of poly(p-hydroxystyrene) having a molecular weight of 6,000 daltons was dissolved in 230 ml in 1N NaOH solution. To this solution was added 1.5 ml formalin solution (40% aqueous solution of formaldehyde) drop wise with stirring to produce a mixture. The mixture was kept at 40° C. with stirring for 3 days after which it was treated with 1 equivalent of oxalic acid and precipitated product was isolated, washed repeatedly with $H_2O$ and dried under vacuum to obtain about 23 gms of off-white solid. The pH is preferably neutral to prevent premature cross-linking.

EXAMPLE 7

Conductive Adhesive with Poly(P-Hydroxystrene)

Poly(p-hydroxystyrene) of mw 2000 could also be dissolved in Arocy L10 in an amount up to 20%. The conductive adhesive therefrom showed reduced bleed than a comparative adhesive made with cyanate ester alone without the additive.

EXAMPLE 8

Hydroxymethylated Novolak and Conductive Adhesive with This as an Additive with Arocy L10

A 10% hydroxymethylated novolak was prepared by following the procedure described for poly(p-hydroxystyrene) described in EXAMPLE 6 and substituting an equal amount of novolak for the poly(p-hydroxystyrene). A conductive adhesive was prepared using this additive and the cyanate ester resin Arocy L10 and the procedure described in EXAMPLE 1. The results of tests described in EXAMPLE 2 showed no evidence of resin bleed and thermal shock and temperature and humidity stress exposure caused no change in shear strength.

The adhesive does not exhibit bleed out so there is no contamination of wire bond pads by the adhesive, results in a bond that exhibits good resistance to temperature and humidity which permits the adhesive to be used in packages that are not hermetically sealed and is stable at high temperatures.

It presently is theorized that the above-described advantages are achieved because of the combination of the resin and the additive results in them being in a more stable dispersion with the conductive material; and that the additive reacts with any low molecular weight fractions of the resin that may be present and also self condenses during high temperature cure to form high molecular weight polymers so that the resin does not separate.

This invention has been described in terms of specific embodiments set forth in detail. It should be understood, however, that these embodiments are presented by way of illustration only, and that the invention is not necessarily limited thereto. Modifications and variations within the spirit and scope of the claims that follow will be readily apparent from this disclosure, as those skilled in the art will appreciate.

We claim:

1. An adhesive prepared from a resin composition, the resin composition consisting of:

a resin consisting of an aryl cyanate ester resin or an aryl cyanate resin, and a member selected from the group consisting of cycloaliphatic and aliphatic diepoxide resins and bisphenol A diepoxide resins; and an additive a consisting essentially of a hydroxymethyl functionalized oligomeric/polymeric phenolic resin having the formula:

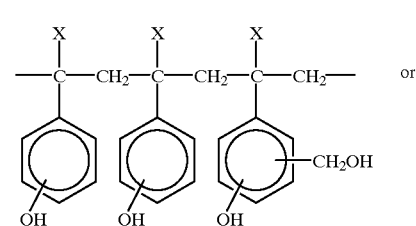

I.

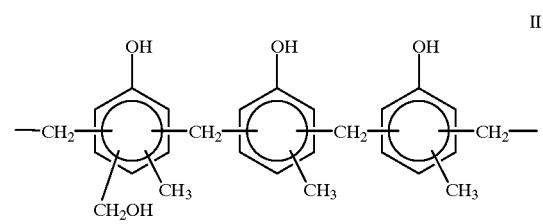

II.

wherein X is H, $CH_3$ or $C_2H_5$, and wherein the additive has a degree of hydroxymethylation in the range of about 5 to about 15 percent based on the molar equivalent of the monomer unit of novolak or poly(hydroxy-styrene), the resin and the additive being an admixture.

2. An adhesive prepared from a resin composition, the resin composition consisting of:

a resin consisting of an aryl cyanate ester resin or an aryl cyanate resin, and a member selected from the group consisting of cycloaliphatic and aliphatic diepoxide resins and bisphenol A diepoxide resins; and an additive consisting of a hydroxymethyl functionalized oligomeric/polymeric phenolic resin having the formula:

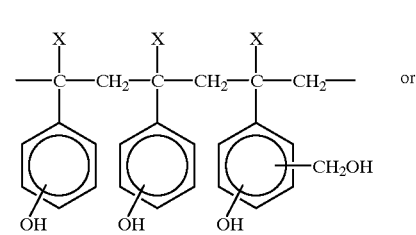

I.

-continued

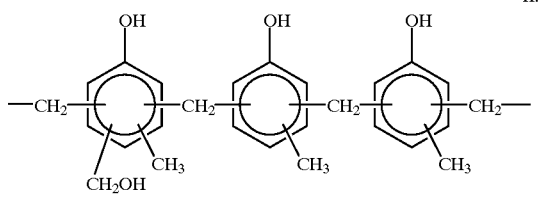
II.

wherein X is H, CH₃ or C₂H₅, and wherein the additive has a degree of hydroxymethylation in the range of about 5 to about 15 percent based on the molar equivalent of the monomer unit of novolak or poly(hydroxy-styrene), the resin and the additive being an admixture.

3. An adhesive prepared from a resin composition, the resin composition consisting essentially of:
a resin consisting of an aryl cyanate ester resin or an aryl cyanate resin, and a member selected from the group consisting of cycloaliphatic and aliphatic diepoxide resins and bisphenol A diepoxide resins; and
an additive consisting essentially of a hydroxymethyl functionalized oligomeric/polymeric phenolic resin having the formula:

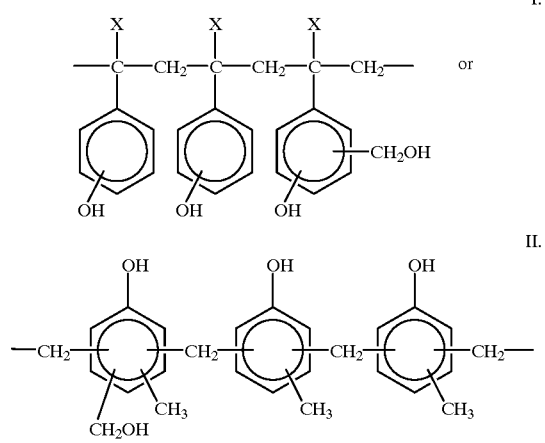

wherein X is H, CH₃ or C₂H₅, and wherein the additive has a degree of hydroxymethylation in the range of about 5 to about 15 percent based on the molar equivalent of the monomer unit of novolak or poly(hvdroxy-styrene), the resin and the additive being an admixture.

4. The adhesive according to claims 1, 2 or 3 wherein the resin is a liquid resin at room temperature.

5. The adhesive according to claims 1, 2 or 3 wherein the resin is the cyanate ester resin.

6. The adhesive according to claims 1, 2 or 3 wherein the resin is a diepoxy resin selected from the group consisting of:
3,4-epoxy cyclohexyl methyl-3,4-epoxy cyclohexane carboxylate; bis-3,4-epoxy cyclohexyl adipate; bis-epoxide derived from 4-vinyl-1-cyclohexene; bis-(3,4-epoxycyclohexyl) adipate;
2,2-bis (4-glycidoxyphenyl)propane; 1,4-butane diol diglycidyl ether; diglycidyl ether of bisphenol F; and mixtures thereof.

7. The additive according to claims 1, 2 or 3 wherein the additive has a molecular weight in the range of about 1,000 to about 8,000 daltons.

8. The adhesive according to claims 1, 2 or 3 wherein the additive is a hydroxymethylated novolak or poly(p-hydroxystyrene) having a degree of hydroxymethylation in the range of about 8 to about 15 percent based on the molar equivalent of formaldehyde used for a molar equivalent of the monomer unit of novolak or poly(hydroxy-styrene).

9. The adhesive according to claims 1, 2 or 3 wherein the weight ratio of resin to additive is in the range of about 95:5 to about 80:20.

10. The adhesive according to claims 1, 2 or 3 further comprising, in admixture, a filler.

11. The adhesive of claim 10 wherein the filler is present in a weight ratio of resin or resin and additive to filler in the range of about 15:85 to about 50:50.

12. The adhesive of claim 10 wherein the filler is a conductive filler.

13. The adhesive of claim 10 wherein the filler is metal flakes.

14. The adhesive according to claims 1, 2 or 3 wherein the cyanate ester resin is selected from the group consisting of the prepolymer from the liquid dicyanate monomer ethylidene bis (4,1-phenylene dicyanate); dicyanates of the type NCO—(AR)—R₁—(AR)—OCN where R₁ is selected from the group of O, SO₂ and C(CH₃)₂, and Ar represents an aryl group liquid dicyanate ester monomer derived from 4,4'-[1,3 phenylene bi(1-methylethylidene bis-phenylcyanate)]; 4,4-dicyanato-2,2-diphenyl perfluoropropane; bis(4-cyanatophenyl)ether; tetra-o-methyl bisphenol F dicyanate; cyanate ester resins based on bisphenol A and mixtures thereof.

15. The adhesive according to claims 1, 2 or 3 wherein the additive formula is

I.

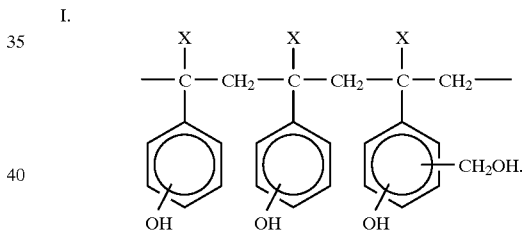

16. The adhesive according to claims 1, 2 or 3 wherein the additive formula is

II.

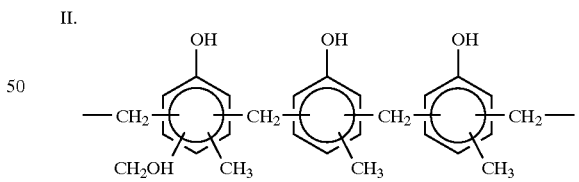

17. The adhesive according to claims 1, 2 or 3 wherein the first resin is further characterized by the absence of a solvent.

18. The adhesive of according to claims 1, 2 or 3 wherein the additive is selected from the group consisting of, hydroxymethyl-cresol formaldehyde resin, hydroxymethyl novolak resin other than the hydroxymethyl-cresol formaldehyde resin, hydroxymethyl poly-(hydroxystyrene) and hydroxymethyl alpha-methyl-poly(hydroxystyrene).

* * * * *